United States Patent [19]

Sano et al.

[11] Patent Number: 4,736,160

[45] Date of Patent: Apr. 5, 1988

[54] NUCLEAR MAGNETIC RESONANCE IMAGING METHOD

[75] Inventors: Koichi Sano; Shimbu Yamagata; Koichi Haruna, all of Yokohama; Hideaki Koizumi, Katsuta; Shinichi Sato, Yokohama; Tetsuo Yokoyama, Tokyo; Ryuzaburo Takeda, Mito, all of Japan

[73] Assignee: Hitachi, Ltd., Tokyo, Japan

[21] Appl. No.: 867,541

[22] Filed: May 28, 1986

[30] Foreign Application Priority Data

May 29, 1985 [JP] Japan .............................. 60-114082
Aug. 16, 1985 [JP] Japan .............................. 60-179421

[51] Int. Cl.$^4$ ............................................. G01R 33/20
[52] U.S. Cl. ...................................... 324/312; 324/307
[58] Field of Search ............... 364/414; 324/312, 307, 324/309

[56] References Cited

U.S. PATENT DOCUMENTS 4,591,789 5/1986 Glover et al. ........................ 324/307
4,649,346 3/1987 Yeung et al. ........................ 324/312

OTHER PUBLICATIONS

Automatic correction of NMR zeugmatographic projections Ching-Ming Lai & P. C. Lauterbur Phys. E. Sci. Instum., vol. 14, '81.

Primary Examiner—Stewart J. Levy
Assistant Examiner—Louis M. Arana
Attorney, Agent, or Firm—Antonelli, Terry & Wands

[57] ABSTRACT

In order to make an accurate display possible even in case image data having been subjected to a Fourier transformation have negative values, the sampling timing deviations of measured signals having phase errors based on various factors are detected from the gradient of the linear components of the image data having been subjected to the Fourier transformation, and the density values of the image having the detected timing deviations corrected are displayed.

7 Claims, 7 Drawing Sheets

NUCLEAR MAGNETIC RESONANCE IMAGING METHOD

BACKGROUND OF THE INVENTION

The present invention relates to a tomograph which makes use of the nuclear magnetic resonance (which will be abbreviated to "NMR") and which is used for medical diagnosis.

The problem of a timing error in the measurement of an NMR signal is solved in the prior art by displaying the absolute (spectral) value of an image obtained (as should be referred to the third line from the bottom of pp. 232, "Technical alternatives in nuclear magnetic resonance (NMR) imaging", SPIE 1983, written by P. A. Bottomley, for example).

This problem will be discussed in detail in the following.

Now, for simplicity of discussion, consideration will be taken into a one-dimensional signal, but a similar discussion applies to a two-dimensional signal. If the NMR signal is expressed by f(t), the NMR signal has its real part obtained in the form of an even function and its imaginary part obtained in the form of an odd function according to its characteristics, as shown in (i) and (ii) of FIG. 1(a).

Hence, the Fourier transformation F(x) of f(t) is expressed by a real function in accordance with its characteristics:

$$F(x) = F[f(t)] \qquad (1).$$

If F(x) is expressed in a polar form, therefore, the phase component is zero:

$$F(x) = A(x)e^{j0} = A(x) \qquad (2).$$

Figures 1, 1A, 1B, 1C:
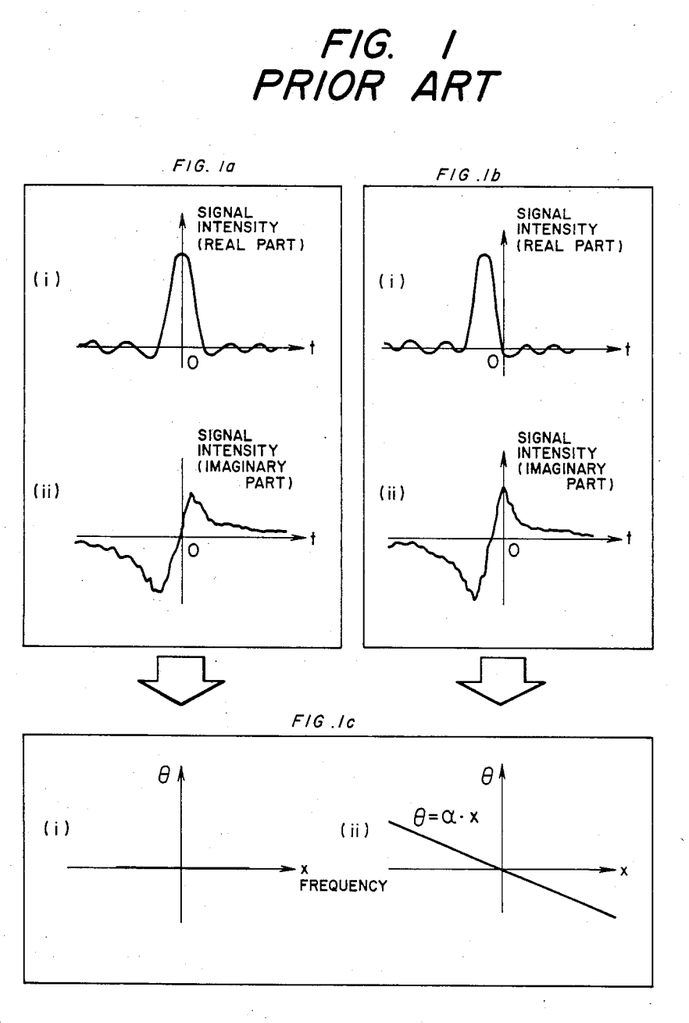
FIG. 1 is a diagram showing one example of the relationship between the measuring timing deviation and the phase angle of the date after the measured signal has been subjected to the Fourier transformation.

Here, if the measuring timing of f(t) deviates by a, as shown in FIG. 1(b), then:

$$f'(t) = f(t + a) \qquad (3).$$

The Fourier-transformed component F'(x) is determined by:

$$\begin{aligned} F'(x) &= f[f(t + a)] \\ &= F(x)e^{jax} \\ &= A(x)e^{jax}. \end{aligned} \qquad (4)$$

In other words, the phase component θ, which should not intrinsically exist, as shown in (i) of FIG. 1(c), appears in the form proportional to x, as shown in (ii) of FIG. 1(c).

If a phase is to be determined from an actual data, not only the phase deviation ax due to the timing deviation a but also the phase deviation due to the characteristics of a receiver and the phase deviation due to inhomogeneities of the magnetic field are superposed, the phase determined is not correct in a low-level position of the measured signal but takes a random value.

In the NMR imaging, by noting that F(x) gives the value sought for, the image is generally displayed in an absolute value by making use of the characteristics of the Fourier transformation that the absolute value of F(x) is not influenced by the time deviation of f(t):

$$| = F'(x) | = |A(x)e^{jax}| = |A(x)| - F(x) \qquad (5)$$

The method described above is effective because of its simple processing but is accompanied by a defect that a correct image cannot be obtained unless the value of F(x) is positive, because the absolute value is taken.

SUMMARY OF THE INVENTION

A primary object of the present invention is to provide an imaging method which can obtained a correct density even in case the density of a transverse, sagittal or coronal image to be determined has a negative value.

In order to achieve this object, it is necessary to accurately determine and correct the timing deviation of a measured signal. As has been described hereinbefore, the timing deviation of the sampling of an NMR-measured signal appears as a phase deviation proportional to a frequency in the frequency space. Noting this point, the present invention is characterized in that the deviation is corrected by estimating the gradient of a straight line from the phase data of the measured signal by the method of least squares and by detecting the timing deviation of the sampling of the measured signal from the estimated gradient.

At this time, it is also necessary to consider other factors for causing the phase deviation. First of all, the phase error coming from the detecting system is a simple shift in the frequency space. Therefore, the phase error raises no problem in case the gradient is to be calculated. On the other hand, the phase error due to inhomogeneities of the magnetic field is caused in proportion to the error of the magnetic field. Here, since the magnetic field error can be approximated by a paraboloid having its apex at the center of the magnetic field, the linear component of the phase error due to the magnetic field error is substantially zero to exert little influence if an object is positioned at the center of the magnetic field.

Moreover, phase data having a bad S/N ratio has to be eliminated when the gradient is to be estimated. For example, if a power spectrum determined is equal to or lower than a predetermined threshold value, then the phase data can be eliminated because it is not reliable.

By determining the gradient of a straight line after noise data elimination by the estimating method of least squares and by correcting the phase error, as has been described above, the timing deviation can be corrected to display the correct data.

A secondary object of the present invention is to provide an imaging method which can obtain a correct density by completely eliminating such an error of an arbitrary oblique section as is caused due to the characteristics of a tomograph.

For this object, the present invention is characterized by repeating a P1 error correction in accordance with the principle to be described in the following.

The phase error caused by the nuclear magnetic resonance diagnostic apparatus is composed of major factors: the P0 error due to the characteristics of the receiver, i.e., due to the phase deviation between the measured signal and the detected signal; and the P1 error due to the deviation of the origin of the time axis of the sampling point due to the dynamic characteristics of an oblique magnetic field. Means for analytically eliminating those strains has already been developed, and the former error is corrected by determining the phase rotation (according to the P0 correction) such that the integrated value of the measured signal after its one-dimensional Fourier transformation may be maximized. On the other hand, the latter error can be eliminated (according to the P1 correction) by correcting the gradient of the phase component by the estimation of least squares while noting that the image data after the two-dimensional Fourier transformation of the signal will change in proportion to the position of the signal in the reading direction due to the time deviation.

However, in case an arbitrary oblique section is to be subjected to tomography, as is different from the case of a section such as a transverse, sagittal or coronal section which is aligned with the directions of gradient magnetic fields (which are expressed by $G_X$, $G_Y$ and $G_Z$) on three application axes (i.e., X, Y and Z axes), the P1 error is caused not only in the reading direction but also in the phase encoding direction so that the aforementioned correction is insufficient. This comes from the following causes. When the transverse section is to be subjected to the tomography, the gradient magnetic fields $G_Z$, $G_Y$ and $G_Z$ may be applied in the slicing, phase encoding and signal reading directions, respectively. Those gradient magnetic fields may be interchanged in the cases of the sagittal and coronal sections. As a result, the gradient magnetic fields for the slice section selection, phase encoding and reading are sequences which are completely independent of one another.

For simplicity, here is considered as a section having an arbitrary oblique section which is turned by $\theta$ on the X axis. This section also has its slice and phase encoding direction axes turned by $\theta$ and called Y' and Z' axes. When this section is to be subjected to tomography, therefore, the gradient magnetic fields ($G_{Z'}$ and $G_{Y'}$) for slice section selection and phase encoding are applied as the composed of magnetic fields $G_Z$ and $G_Y$ and expressed by the following equations:

$$G_{Z'} = G_Z \cos\theta - G_Y \sin\theta \quad (6);$$

and $$+G_{Y'} G_Z \sin\theta - G_Y \cos\theta \quad (7).$$

These equations (6) and (7) are rewritten into the following equations (8) and (9):

$$G_Z = G_{Z'} \cos\theta - G_{Y'} \sin\theta \quad (8);$$

and $$G_Y = G_{Z'} \sin\theta + G_{Y'} \cos\theta \quad (9)$$

This corresponds to the fact that both the gradient magnetic field sequences $G_Z$ and $G_Y$ contain therein the gradient magnetic fields for slice section selection and phase encoding. As a result, the slice selecting gradient magnetic field in each sequence influences the phase encoding gradient magnetic field so that a sampling timing deviation is caused in the phase modulating direction, too. This newly makes the correction of the timing deviation necessary, and it can be concluded that the P1 correction may be in the two directions, i.e., the reading and phase encoding directions.

Since, in this case, the P1 strains are caused in the two directions, however, their mutual influences make one correction difficult to completely eliminate those strains, and it is necessary to repeat the corrections in two directions, for example, alternately and sequentially.

DESCRIPTION OF THE PREFERRED EMBODIMENTS

Figure 2:
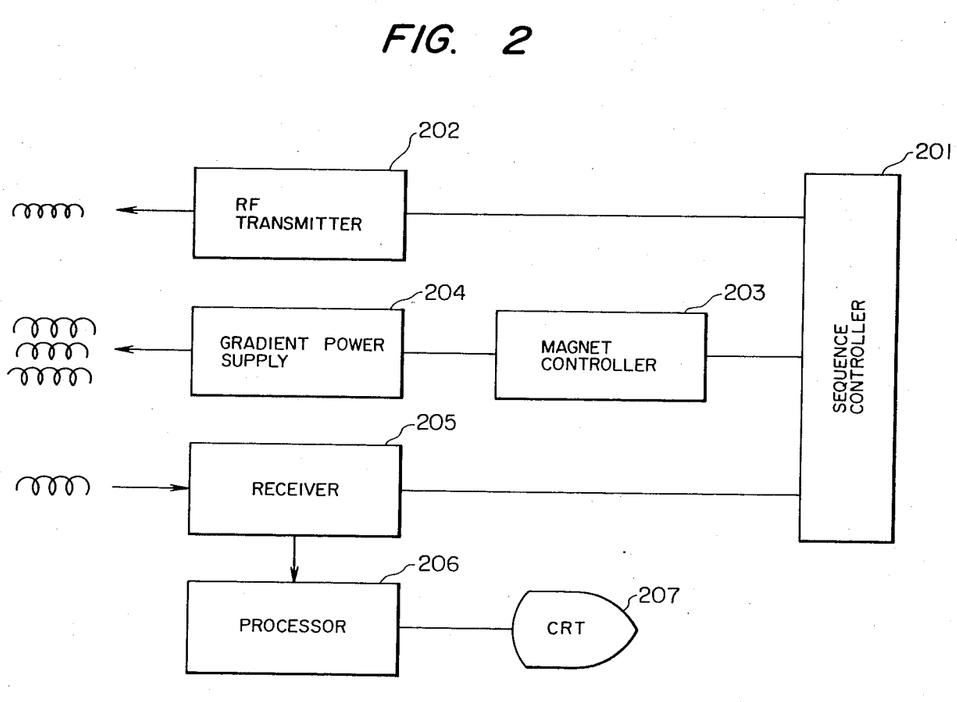
FIG. 2 is a block diagram showing one embodiment of the present invention.

The present invention will be described in detail in the following in connection with the embodiments thereof. FIG. 2 is a block diagram showing the structure of one embodiment of the present invention. By a sequence controller 201 for controlling various pulses and magnetic fields generated to detect an NMR signal from an object, there are controlled: a transmitter 202 for transmitting RF pulses generated to resonate a specific kind of nucleus in the object; a magnetic field controller 203 for generating a gradient magnetic field capable of arbitrarily controlling the intensity and direction of a static magnetic field determining the resonance frequency of the NMR signal; and a receiver 205 for detecting and measuring the NMR signal generated from the object. An image is reconstructed by a processor 206 on the basis of the measured signal fed from the receiver 205, and the image thus reconstructed is displayed on a CRT display 207. A magnetic field driver 204 generates a magnetic field necessary for the measurement on the basis of a control signal outputted from the aforementioned magnetic field controller 203.

Figure 3:
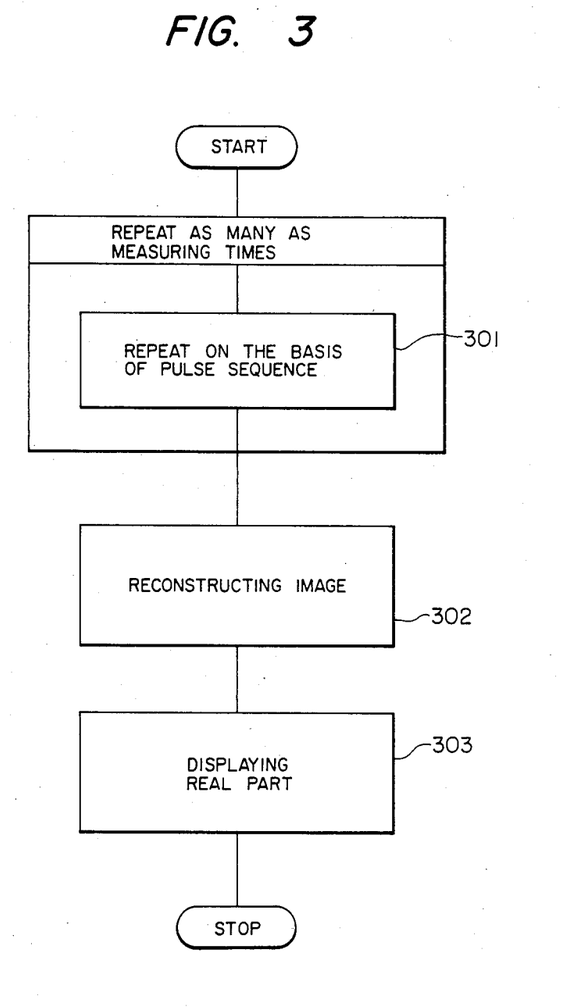
FIG. 3 is a flow chart showing the processing procedures of the present invention.

A method of practising the present invention thus constructed will be described in the following with reference to FIGS. 2 to 7. FIG. 3 is a flow chart showing the whole imaging procedures according to the present invention. Here will be described an example in which the image is reconstructed by making use of the two-dimensional Fourier transformation in a pulse sequence using the spin echo method, but a similar conception can apply even in case the image is reconstructed by making use of a projecting reconstruction method. The respective processing steps of FIG. 3 will be described in the following by using the pulse sequence of the two-dimensional Fourier transformation shown in FIG. 4.

Figure 4:
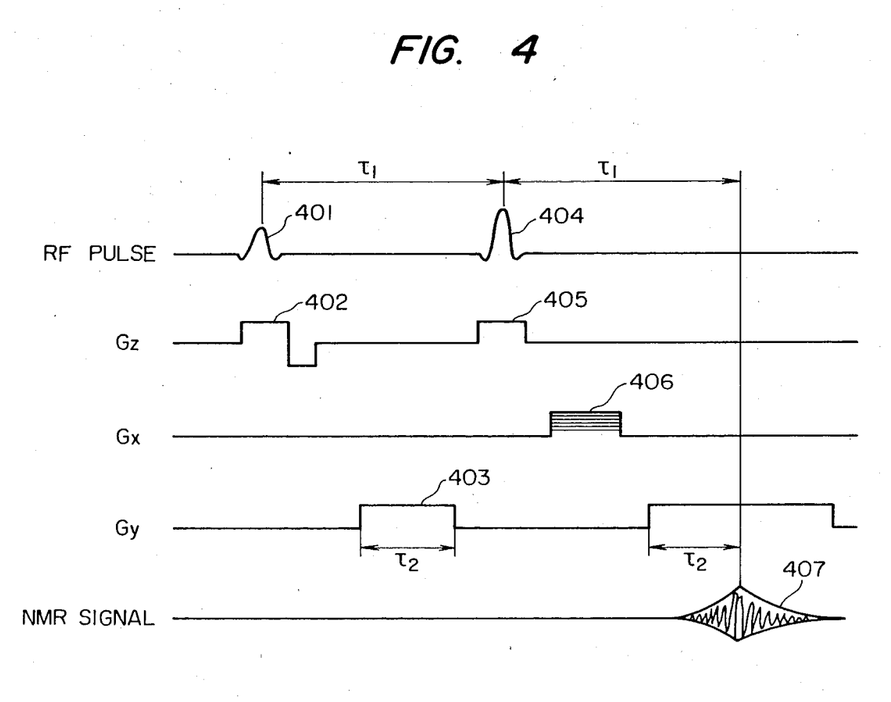
FIG. 4 is a diagram showing one example of a pulse sequence for practising the present invention.
Figure 5:
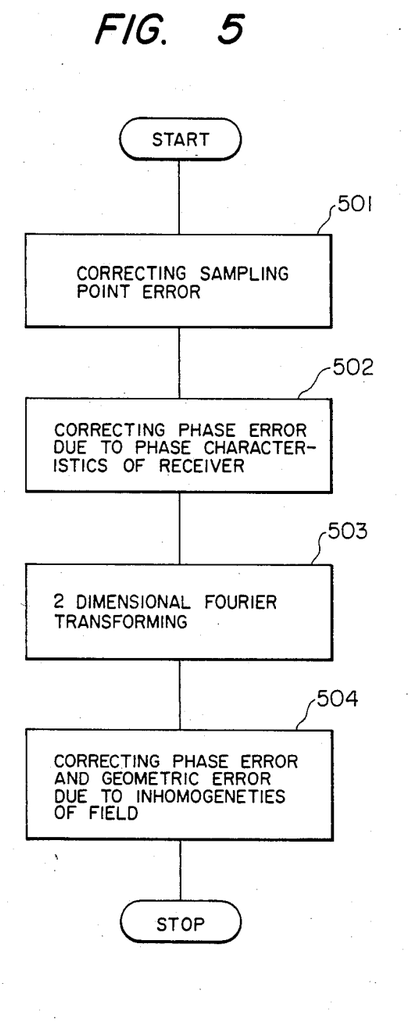
FIG. 5 is a flow chart showing the error correcting procedures of the present invention.

Step 301: The object is subjected to tomography in accordance with the pulse sequence of FIG. 4, and the NMR signal 407 is measured 256 times. More specifically:

(1) From the transmitter 202, a 90 degree pulse 401 is irradiated as the RF pulse containing such a frequency component as can select a specific slice when a gradient magnetic field ($G_Z$) 402 is applied. By this pulse, the nuclear spin in the specific slice falls by 90 degrees.

(2) In order to generate a spin echo, a pulse 404 of 180 degrees is applied a period $\tau_1$ after from the transmitter 202. At this time, the gradient magnetic field ($G_Z$) is applied from the magnetic field driver 204 to select the same slice as that when the 90 degree pulse is applied. Incidentally, for the period $\tau_1$, a gradient magnetic field ($G_Y$) 403 is applied for a period $\tau_2$ from the magnetic field driver 204. The period $\tau_2$ corresponds to one half of that for observing the NMR signal 407, and the magnetic field 403 is applied for positioning the sampling origin of the NMR signal. By that 180 degree pulse, the spin in the slice is inverted by 180 degrees.

(3) While the NMR signal 407 to be observed is generated the period $\tau_1$ after the 180 degree pulse, a gradient magnetic field ($G_X$) 406 in the X direction (i.e., the phase encoding direction) is applied. Phase information according to the position is added to the observed signal, and this intensity is sequentially changed when in the repeated observations.

(4) A gradient magnetic field in the Y direction begins to be applied $(\tau_1 - \tau_2)$ after the 180 degree pulse, and the NMR signal 407 is observed through the receiver 205. The signal observed is subjected to a quadrature detection and is then sent to the processor 206.

In the procedures described above, the gradient magnetic fields $G_X$, $G_Y$ and $G_Z$ are controlled by the magnetic field controller 203.

Step 302: The signal obtained after the quadrature detection has been subjected to errors for various factors. The errors imparting serious influences to the phase information are made by the following three:
(1) The deviation of the origin of the sampled position of the NMR signal;
(2) The characteristics of the receiver; and
(3) The inhomogeneities of the magnetic fields.
The two-dimensional Fourier transformation is conducted to reconstruct the image while conducting those error corrections. The detail of the processing will be described hereinafter.

Step 303: the NMR image obtained at the preceding step 302 is indicated by a complex signal expressed by the following equation:

$$f(x,y) = f_R(x,y) + if_I(x,y) \qquad (10).$$

After the later-described error correction at the step 302, the $f_I(x,y)$ component of the imaginary part is substantially zero:

$$f(x,y) \approx f_R(x,y); \qquad (11)$$

and $$ang[f(x,y)] = \arctan[f_I(x,y)/f_R(x,y)] \qquad (12)$$

$$\approx 0.$$

Hence, the real part is displayed in the CRT display 207.

The general processing procedures except the error correction has been described hereinbefore. Next, the error correctinig procedures will be described in accordance with the flow chart of FIG. 5.

Step 501: The origin of the time axis of the NMR signal 407 observed by the receiver 205 must intrinsically be located $2\tau_1$ time after the 90 degrees, but is slightly deviated by a cause such as the rising characteristics of the gradient magnetic field. By making use of the characteristic that the measured data when the gradient magnetic field ($G_X$) 406 is not applied has its real part expressed by an even function and its imaginary part expressed by an odd function, the time deviation of the aforementioned origin (which deviation will be shortly called the "origin deviation" having a magnitude $a$) is detected, and the measured data is corrected. The detail of the detecting method will be described hereinafter.

Step 502: The origin of the NMR data corrected at the preceding step 501 is noted. If the observed signal and the detected signal are in phase, the origin of the measured data when the gradient magnetic field ($G_X$) 406 is not applied has a positive real part and a zero imaginary part. Generally speaking, however, the phase is changed depending upon the characteristics of the receiver, and that condition is not satisfied. Hence, the calculation angle is determined on the basis of the following equation:

$$\theta = \text{sgn}(g_I(0,0))\arccos(\alpha),$$

wherein $$\alpha = g_R(0,0)/\sqrt{g_R^2(0,0) + g_I^2(0,0)},$$

$$0 < \cos^{-1}(\alpha) < \pi$$

And, $g(0,0)$ is the value for $t=0$ when $G_X=0$. By using the angle $\theta$ obtained, the following corrections are made for all the measured data:

$$\left.\begin{array}{l} \overline{g}_R(p,t) = g_R(p,t)\cos\theta + g_I(p,t)\sin\theta; \\ \overline{g}_I(p,t) = -g_R(p,t)\sin\theta + g_I(p,t)\cos\theta; \\ \text{and} \\ \overline{g}(p,t) = \overline{g}_R(p,t) + i\overline{g}_I(p,t). \end{array}\right\} \qquad (13)$$

Step 503: The measured data obtained at the preceding step 502 is used for the two-dimensional Fourier transformation:

$$\begin{aligned} f[\overline{g}(p,t)] &= f(x,y) \\ &= f_R(x,y) + if_I(x,y). \end{aligned} \qquad (14)$$

This result forms the NMR image.

Step 504: If the inhomogeneous magnetic field is expressed by $E(x,y)$, the following relationship then holds between the image $f(x,y)$ reconstructed and the image $f(x,y)$ for $E(x,y)$:

$$\overline{f}(x + 1/G_X \cdot E(x,y), y) = \qquad (15)$$

$$f(x,y) \cdot \exp[2\pi i\gamma E(x,y)t]/[1 + 1/G_X \cdot \partial E(x,y)/\partial x],$$

wherein:
  $\gamma$: Rotational ratio of nuclear magnetism;
  t: Time period under inhomogenous magnetic field.

Hence, the following corrections may be made:
(1): the geometric error of $x' = x \cdot 1/G_X \cdot E(x,y)$;
(2): the density error of $1/[1 + 1/G_X \cdot \partial E(x,y)/\partial x]$; and
(3): around the phase of $2\pi\gamma E(x,y)t$.

These corrections can be easily executed if $E(x,y)$ is known, as is described in "Image restoration from non-uniform magnetic field influence for direct Fourier NMR imaging", Phys. Med. Biol. 1984, vol. 29, No. 1, pp 15 to 24.

Incidentally, the methods for making corrections after the origin deviation $\alpha$ has been detected at the aforementioned step 501 are divided into the following three kinds:

(1) After the measured data has been subjected to the one-dimentional Fourier transformation, a phase correction proportional to the frequency is made, and the data is restored by an inverse Fourier transformation;

(2) The measured data is resampling by a sinc function (i.e., sin $cx = \sin x/x$); and (3) A phase correction proportional to the position is made in the X direction of the reconstructed image.

Although any of those methods provides equivalent results, the method (3) is the most suitable from the standpoint of the calculated period. The phase changes linearly in dependence upon the position. The gradient corresponds to the aforementioned time error $\alpha$, and the image is corrected on the basis of the following equations:

$$\begin{aligned} \bar{f}_R(x,y) &= f_R(x,y)\cos\alpha x + f_I(x,y)\sin\alpha x; \\ \text{and} \\ \bar{f}_I(x,y) &= -f_R(x,y)\sin\alpha x + f_I(x,y)\cos\alpha x, \end{aligned} \quad (16)$$

wherein:

$if_I(x,y) = \bar{f}_R(x,y) + \bar{f}_I(x,y)$: Image after correction.

The description thus far made is directed to the whole error correcting procedures. Next, the detailed procedures for correcting the origin error at the step 501 will be described with reference to the flow chart of FIG. 6. The data to be processed is the measured data $g(0,t)$ when the gradient magnetic field $G_Z$ is not applied, and will be expressed by $g(t)$ for simplicity of discussion. If the data $g(t)$ is a true signal, the signal observed actually deviates by the period. $\alpha_1$, and is expressed by $g(t-\alpha_1)$.

Figure 6:
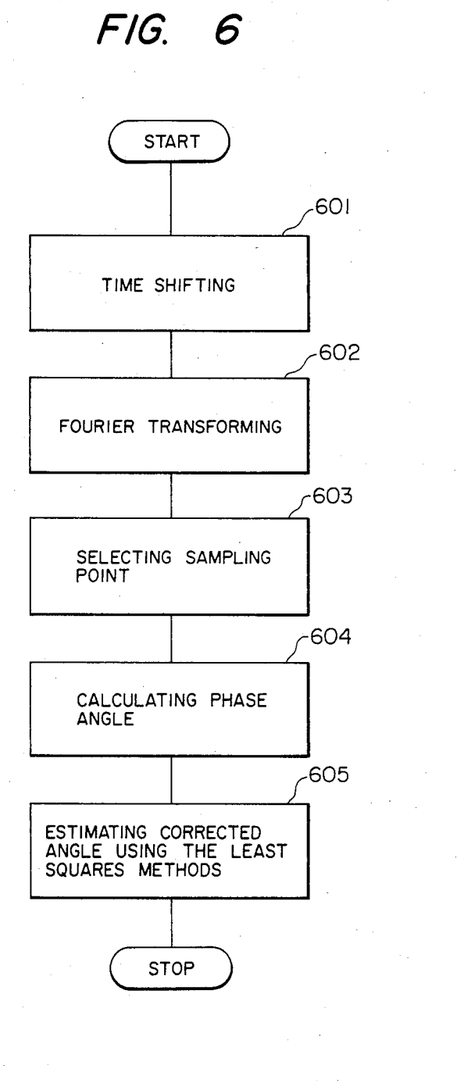
FIG. 6 is a flow chart showing the correcting procedures of the errors due to the measuring timing deviation according to one of the error corrections.

Step 601: The peak value of the sampling points is brought to the position of the origin. By this processing, the positional deviation $\alpha$ of the origin is equal to or smaller than one sampling point. This is expressed by the following equation:

$$g(t-\alpha)(\alpha < \text{Sampling interval}) \quad (17).$$

Step 602: The signal $g(t-\alpha)$ is subjected to the Fourier transformation. That is to say:

$$F[g(t-\alpha)] = G(x)e^{-\alpha x} = \hat{G}(x) \quad (18),$$

wherein:

$[g(t)] = G(x)$.

The value $G(x)$ takes a real one in accordance with the characteristics of $g(t)$.

Step 603: For each sampling point (which is designated by $x_i$) of x of the equation (18), the following value is determined:

$$A_{ng}[G(x)e^{-i\alpha x}] = -\alpha x \quad (19).$$

Since the noises are superposed, the measuring position $\beta(x_i)$ is usually expressed by the following equation:

$$\beta(x_i) = -\alpha x_i + n_i \quad (20),$$

wherein:

$n_i$: noises.

Since the reliability of the value $\beta(x_i)$ is thought to become larger generally in proportion to the magnitude of the amplitude $G(x_i)$, only the sampling point $x_i$ having the magnitude of $G(x_i)$ equal to or larger than a predetermined value is selected.

Step 604: As to the sampling point $x_i$ selected at the preceding step, the phase angle $\beta(x_i)$ is determined on the basis of the following equation:

$$\beta(x_i) = \text{sgn}(G_I(x_i)) \arccos\left\{ \frac{G_R(x_i)}{\sqrt{G_R^2(x_i) + G_I^2(x_i)}} \right\}, \quad (21)$$

wherein:

$G(x) = G_R(x) + iG_I(x)$

Step 605: The gradient $\alpha$ is estimated by least squares. That is to say, the gradient $\alpha$ is calculated by the following equation:

$$\alpha = \frac{\sum\limits_{x_i\in\Omega} 1 \times \sum\limits_{x_i\in\Omega}\{\beta(x_i) \times x\} - \sum\limits_{x_i\in\Omega} x_i \times \sum\limits_{x_i\in\Omega} \beta(x_i)}{\sum\limits_{x_i\in\Omega} x_i^2 \times \sum\limits_{x_i\in\Omega} 1 - \left(\sum\limits_{x_i\in\Omega} x_i\right)^2}. \quad (22)$$

By using the gradient $\alpha$ calculated, the deviation of the origin at the step 501 is corrected in accordance with the equation (16).

Although the description made above is directed to the two-dimensional Fourier transformation, the projection reconstructing method can also be accomplished.

Figure 7:
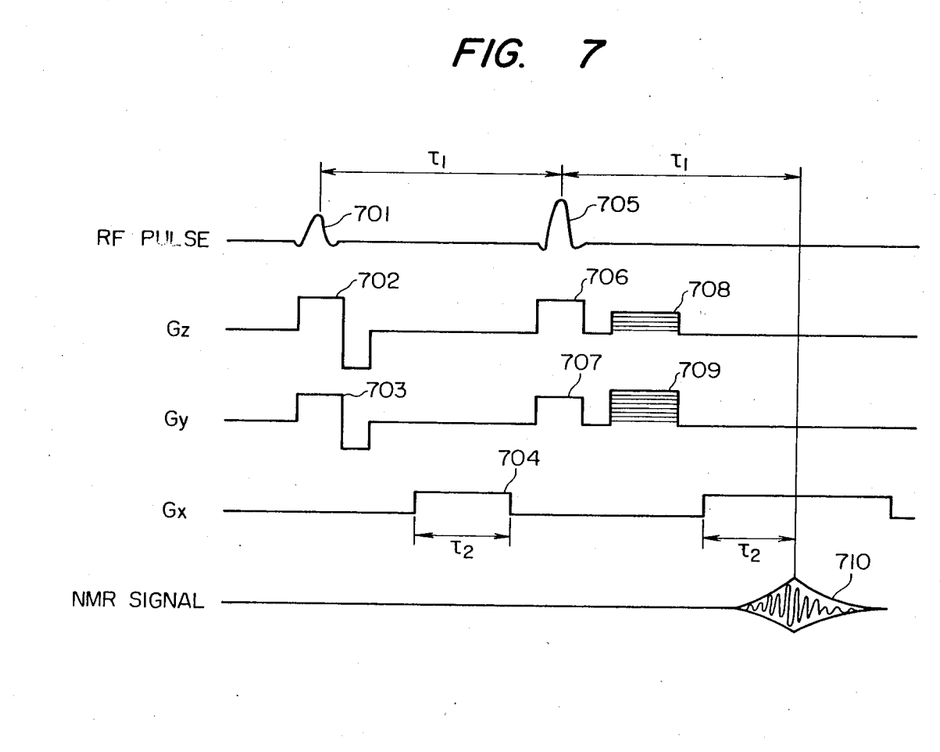
FIG. 7 is a diagram showing one example of a pulse sequence for practising the present invention.

The experimental results of correcting the deviation of the origin in accordance with the present invention are shown in FIG. 7. In FIG. 7, (a) shows the phase data of the value $g(0,t)$ before the correction and after the Fourier transformation, and (b) shows the phase data after the correction. By comparing FIGS. 7(a) and 7(b), it is found that the origin deviation is properly corrected according to the present invention. The peripheral portion where the value is highly fluctuating is the background which is made random by the noises although the signal is intrinsically substantially zero.

Next, the respective processing steps of FIG. 3 will be described in connection with the embodiment which uses the pulse sequence (in the case of the phase axis and the two gradient magnetic field axes) for an arbitrary oblique tomography in the two-dimensional Fourier transforming method shown in FIG. 7.

Step 301: The object is subjected to tomography in accordance with the pulse sequence of FIG. 7, and the NMR signal 710 is measured 256 times. More specifically:

(1) From the transmitter 202, a 90 degree pulse 701 is irradiated as the RF pulse containing such a frequency component as can be selected by a composed gradient magnetic field of gradient magnetic fields ($G_Z$, $G_Y$) 702 and 703. Here, the following relationship holds if the direction of the composed magnetic field is on a Z' axis and if the angle contained by the Z and Z' axes is designated at $\theta$:

$$\theta = \tan^{-1}[|G_Y|/|G_Z|] \qquad (23).$$

By the RF pulse, only the nuclear spin in the slice excited by the composed gradient magnetic field falls by 90 degrees.

(2) In order to generate a spin echo, a pulse 705 of 180 degrees is applied a period $\tau_1$ after from the transmitter 202. At this time, the gradient magnetic field ($G_Z$, $G_Y$) 706 and 707 are applied from the magnetic field driver 204 to form the composed magnetic field thereby to select the same slice as the one when the 90 degree pulse is applied. Incidentally, for the period $\tau_1$, a gradient magnetic field ($G_X$) 704 is applied in the X direction for a period $\tau_2$ from the magnetic field driver 204. The period $\tau_2$ corresponds to one half of the one for observing the NMR signal 710, and the magnetic field 403 is applied for phase registration of the sampling origin of the NMR signal. By that 180 degree pulse, the spin in the slice is inverted by 180 degrees.

(3) While the NMR signal 710 to be observed is generated the period $\tau_1$ after the 180 degree pulse, gradient magnetic fields ($G_Z$, $G_Y$) 708 and 709 for phase encoding are applied. Here, the following equation holds if the phase encoding direction is oriented on a Y' axis and if the angle contained by the Y and Y' axes is $\theta$ (which is identical to that of the equation (23)):

$$\theta = \tan^{-1}(|G_Z|/|G_Y|) \qquad (24).$$

This composed magnetic field adds the phase information according to the position in the Y' direction to the observed signal, and this intensity is sequentially changed when in the repeated observations.

(4) A gradient magnetic field in the X direction begins to be applied ($\tau_1 - \tau_2$) after the 180 degree pulse, and the NMR signal 710 is observed through the receiver 205. The signal observed is subjected to a quadrature detection and is then sent to the processor 206.

In the procedures described above, the oblique magnetic fields $G_X$, $G_Y$ and $G_Z$ are controlled by the magnetic field controller 203.

Step 302: The signal obtained after the quadrature detection has been subjected to errors for various factors. The errors imparting serious influences to the phase information are made by the following:
(1) The deviation of the origin of the sampled position of the NMR signal;
(2) The characteristics of the receiver.

The two-dimensional Fourier transformation is conducted to reconstruct the image while conducting those error corrections. The details of the processing will be described hereinafter.

Step 303: the NMR image obtained at the preceding step 302 is indicated by a complex signal expressed by the following equation:

$$f(X,Y) = f_R(X,Y) + if_I(X,Y) \qquad (25).$$

After the later-described error correction at the step 302, the $f_I$ component of the imaginary part is substantially zero:

$$f(X,Y) \approx f_R(X,Y); \qquad (26)$$

and $$ang[f(X,Y)] = \tan^{-1}[f_I(X,Y)/f_R(X,Y)] \qquad (27)$$
$$= 0.$$

Hence, the real part is displayed in the CRT display 207.

The general processing procedures except the error correction has been described hereinbefore. Next, the error correcting procedures will be described in accordance with the flow chart of FIG. 8.

Figure 8:
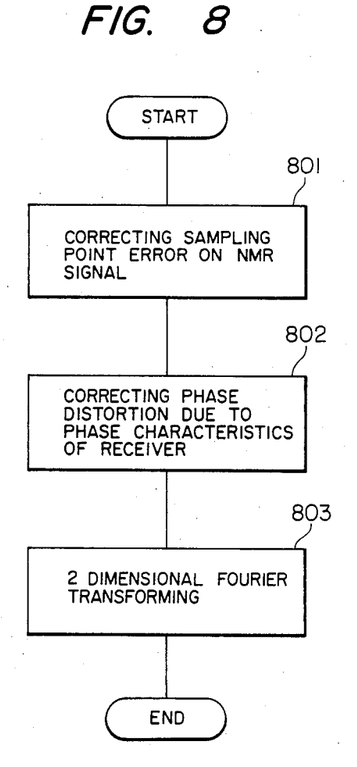
FIG. 8 is a flow chart showing the error correcting procedures of the present invention.

Step 801: The origin of the time axis of the NMR signal observed by the receiver 205 must intrinsically be located $2\tau_1$ time after the 90 degrees, but slightly deviates by a cause such as the rising characteristics of the gradient magnetic field. As has been described in "Summary of the Invention", moreover, since both the sequences $G_Z$ and contain the slice selecting and phase gradient magnetic fields when an arbitrary oblique section is to be subjected to tomography, the former influences the latter so that the origin in the phase encoding direction also deviates. Therefore, the aforementioned two-directional deviations (i.e., the origin deviations which have the magnitudes $a_2$ and $a_1$, respectively, in the phase encoding direction and in the time axis (or reading) direction) are detected, and the measured data is corrected. The details of the detecting method will be described hereinafter.

Step 802: The origin of the NMR data corrected at the preceding step 801 is noted. If the observed signal and the detected signal are in phase, the origin of the measured data when the gradient magnetic fields 708 and 709 for phase encoding are not applied has a positive real part and a zero imaginary part. Generally speaking, however, the phase is changed depending upon the characteristics of the receiver, and that condition is not satisfied. Hence, the calculation angle can be determined on the basis of the following equation:

$$\theta = \text{sgn}(g_I(0,0)) \cos^{-1}(\alpha),$$

wherein $$\alpha = g_R(0,0)/\sqrt{g_R^2(0,0) + g_I^2(0,0)},$$

And, g(0,0) is the value for t=0 when the phase encoding magnetic field is 0. The value $\theta$ may be determined in such manner.

By using the angle $\theta$ thus obtained, the following corrections are made for all the measured data:

$$\left. \begin{array}{l} \bar{g}_R(P,t) = g_R(P,t)\cos\theta + g_I(P,t)\sin\theta; \\ \text{and} \\ \bar{g}_I(P,t) = -g_R(P,t)\sin\theta + g_I(P,t)\cos\theta. \end{array} \right\} \qquad (28)$$

Step 803: The measured data obtained at the preceding step 802 is used for the two-dimensional Fourier transformation:

$$F[\tilde{g}(P,t)] = f(X,Y) \qquad (29)$$
$$= f_R(X,Y) + if_I(X,Y).$$

This result can form the final NMR image.

Incidentally, in case a correction is to be made after the origin deviations $\alpha_1$ and $\alpha_2$ have been detected at the aforementioned step 801, the phase corrections proportional to the positions of the reconstructed image in the X and Y directions are conducted by the following equations:

$$\bar{f}_R(X,Y) = f_R(X,Y)\cos(\alpha_1 X + \alpha_2 Y) + f_I(X,Y)\sin(\alpha_1 X + \alpha_2 Y); \qquad (30)$$

and $$\bar{f}_I(X,Y) = -f_R(X,Y)\sin(\alpha_1 X + \alpha_2 Y) + f_I(X,Y)\cos(\alpha_1 X + \alpha_2 Y),$$

wherein:

$\bar{f}(X,Y) = \bar{f}_R(X,Y) + i\bar{f}_I(X,Y)$: Image after correction.

The description thus far made is directed to the whole error correcting procedures. Next, the detailed procedures for correcting the origin error at the step 801 will be described with reference to the flow chart of FIG. 9. The data to be processed are both the measured data g(t) when the gradient magnetic field in the phase encoding direction is not applied and the data array h(t'), in which the measured data when the phase encoding are changed are arranged in the phase encoding direction, and the origin deviations in the two directions are detected according to the following sequence. Since the origin deviations take place in the two directions, however, those two data arrays deviate in the two directions. Therefore, the origin deviations are not accurately determined by a single correction, and the following sequential processings are required.

Figure 9:
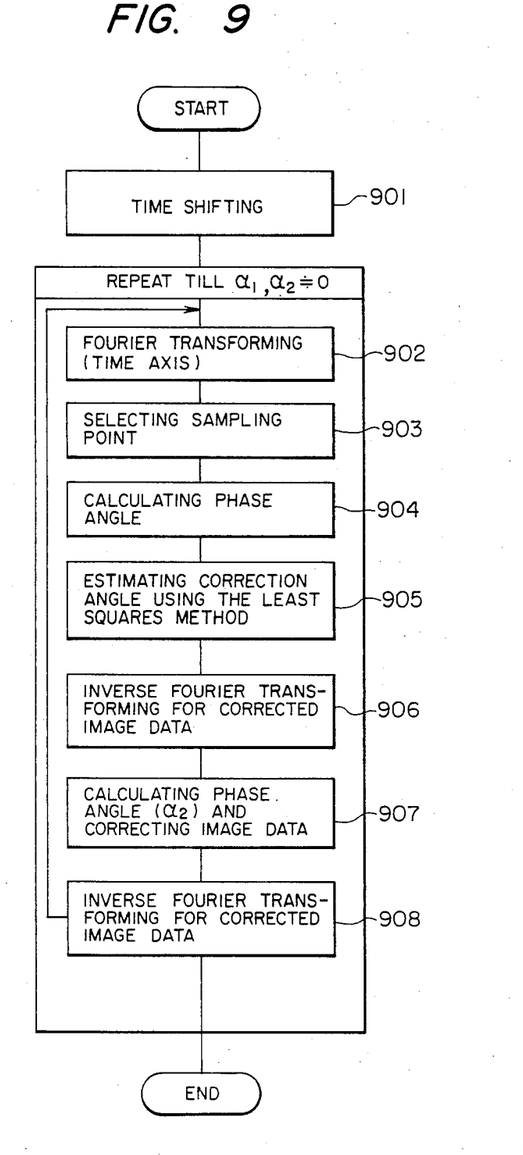
FIG. 9 is a flow chart showing the correcting procedures of the errors due to deviations of the measuring timing on the time axis and in the phase modulating direction according to one of the error correcting procedures.

Step 901: The sampling point where the power $(|\tilde{g})p,t)|^2)$ of a measured signal (g(p,t)) have a maximum (peak value) in the time axis direction and in the phase modulating direction are brought to the position of the origin. By this processing, the positional deviations $\alpha_1$ and $\alpha_2$ of the origin in the two directions are equal to or smaller than one sampling point. These are expressed by the following equations:

$$\left.\begin{array}{l} g(t - \alpha_1)(\alpha_1 < \text{Sampling interval}); \\ \text{and} \\ h(t' - \alpha_2)(\alpha_2 < \text{Sampling interval}). \end{array}\right\} \qquad (31)$$

Step 902: The signal $g(t-\alpha_1)$ is subjected to the Fourier transformation. That is to say:

$$F[g(t-\alpha_1)] = G(x)e^{-i\alpha_1 x} = \bar{G}(x) \qquad (32),$$

wherein:

$[g(t)] = G(x).$

The value G(x) takes a real one in accordance with the characteristics of g(t).

Step 903: For each sampling point (which is designated by $x_i$) of x of the equation (32), the following value is determined:

$$A_{ns}[G(x)e^{-i\alpha_1 x}] = -\alpha_1 x \qquad (33).$$

Since the noises are superposed, the measuring position $\beta(x_i)$ is usually expressed by the following equation:

$$\beta(x_i) = -\alpha_1 x_i + n_i \qquad (34),$$

wherein:

$n_i$: noises.

Since the reliability of the value $\beta(x_i)$ is thought to become larger generally in proportion to the magnitude of the amplitude $G(x_i)$, only the sampling point $x_i$ having the magnitude of $G(x_i)$ equal to or larger than a predetermined value is selected.

Step 904: As to the sampling point $x_i$ selected at the preceding step, the phase angle $\beta(x_i)$ is determined on the basis of the following equation:

$$\beta(x_i) = \text{sgn}(G_I(x_i))\text{arc }\cos G_R(x_i)\sqrt{G_R^2(x_i) + g_I^2(x_i)}, \qquad (35)$$

wherein:

$G(x) = G_R(x) + iG_I(x).$

Step 905: The gradient $\alpha_1$ is estimated by least squares. That is to say, the gradient $\alpha_1$ is calculated by the following equation:

$$\alpha_1 = \frac{\sum\limits_{x_i\in\Omega} 1 \times \sum\limits_{x_i\in\Omega} \{\beta(x_i) \times x\} - \sum\limits_{x_i\in\Omega} x_i \times \sum\limits_{x_i\in\Omega} \beta(x_i)}{\sum\limits_{x_i\in\Omega} x_i^2 \times \sum\limits_{x_i\in\Omega} 1 - \left(\sum\limits_{x_i\in\Omega} x_i\right)^2}. \qquad (36)$$

By using the gradient $\alpha_1$ calculated, the deviation of the origin is corrected for $\alpha_2=0$ in accordance with the equation (30).

Step 906: The image data having been corrected, as above, are subjected to an inverse Fourier transformation, and the data arrays arranged through the origin of the time axis in the phase encoding direction is designated at $h'(t'-\alpha_2)$.

Step 907: The data array $h'(t-\alpha_2)$ is subjected to the Fourier transformation and then processed like the steps 903, 904 and 905 to determined the time deviation $\alpha_2$ in the phase encoding direction, and the origin deviation in the same direction is corrected for $\alpha_1=0$ in accordance with the equation (30) by using the calculated value $\alpha_2$.

Step 908: The image data having been corrected, as above, is subjected to the inverse Fourier transformation until the processing is returned to the step 902.

Thus, the values of the deviations $\alpha_1$ and $\alpha_2$ are tentatively determined by the processings of the steps 901 to 907. The value $g(t-\alpha_1)$ is not correct one because it is determined by assuming that there is no deviation in the phase encoding direction and by neglecting that deviation. This also applies to the value $h'(t'-\alpha_2)$ so that the strictly accurate correction cannot be made by the single one. At the step 908, therefore, the image obtained is subjected to the inverse Fourier transformation and is fed back again by returning to the step 902. By repeating the steps 902 to 908 to complete the processings when both the values $\alpha_1$ and $\alpha_2$ finally take substantially zero, the errors can be corrected substantially completely.

Incidentally, in the aforementioned processings, the corrections are conducted in proportion to the position in the reading direction or the phase encoding direction, but the sampling processings in the frequency space may naturally be conducted in place of the equation (30). In this case, for example, a sinc function is used as that for interpolation.

Furthermore, arccos in eq. (21) or eq. (35) may be arctan.

According to the present invention, a ($T_1$ enhanced) image, which has such a negative value that cannot be correctly reproduced by the prior art method of eliminating the errors of the apparatus for tomography by taking the absolute values, can be correctly reproduced by discriminating the positive and negative. Since only the phase deviation by the apparatus can be eliminated, moreover, the phase components varied by the influences of blood flows or motions can be extracted to measure the blood flows themselves.

According to the present invention, still moreover, even in case not only the transverse, sagittal or coronal section but an arbitrary oblique section is to be subjected to the tomography, it is possible to substantially completely eliminate the artifact of the reproduced image which is caused by the phase deviation of the apparatus.

What is claimed is:

1. In a nuclear magnetic resonance imaging apparatus comprising: generation means for generating static, oblique and RF magnetic fields; detection means for extracting a nuclear magnetic resonance signal from an object to be inspected; and processing means for executing a variety of arithmetic operations including an image reconstruction for the signal detected,
   a nuclear magnetic resonance imaging method comprising the steps of: subjecting to a Fourier transformation a measuring signal when the gradient of an oblique magnetic field in a phase encoding direction is zero; detecting the sampling timing deviation of said measuring signal from the gradient of the linear component of a phase data having been subjected to the Fourier transformation; correcting said timing deviation; and displaying the image corrected.

2. A nuclear magnetic resonance imaging method according to claim 1, wherein the step of detecting said timing deviation makes use of a mean value of the gradient of the linear component of the phase data of a reconstructed image.

3. A nuclear magnetic resonance imaging method according to claim 1 or 2, wherein the step of detecting said timing deviation includes a sub-step of detecting the phase deviation, which is established homogeneously all over the measured data, in accordance with the characteristics of said detecting means.

4. In a nuclear magnetic resonance imaging apparatus comprising: generation means for generating static, gradient and RF magnetic fields; detection means for extracting a nuclear magnetic resonance signal from an object to be inspected; and processing means for executing a variety of arithmetic operations including an image reconstruction for the signal detected,
   a nuclear magnetic resonance imaging method comprising the steps of: detecting the sampling timing deviations of a measured signal in an arbitrarily directional section in both a time axis direction and a phase encoding direction; correcting said timing deviations; and displaying an image corrected.

5. A nuclear magnetic resonance imaging method according to claim 4, wherein the step of detecting said timing deviations includes the sub-steps of: arraying on a two-dimensional plane all the time-series data that are measured by changing a phase encoding gradient magnetic field; subjecting to a one-dimensional Fourier transformation the data arrays which are arranged through the sampling points in both the phase encoding direction and the time axis direction and in which the power of each of said time-series data takes its maximum; determining the sampling deviations in the respective directions by making use of a mean value of the gradients of the linear components of the phase data having been subjected to the Fourier transformation; and making corrections proportional to the positions in the two directions.

6. A nuclear magnetic resonance imaging method according to claim 4 or 5 wherein the step of detecting said timing deviations is conducted by repeating the sub-step of sequentially conducting the corrections in the phase encoding direction and in the time axis direction until the timing deviations in the respective directions become equal to or smaller than a predetermined value.

7. A nuclear magnetic resonance imaging method according to claim 6, wherein the step of detecting said timing deviations includes a sub-step of detecting the phase deviations, which are homogeneously established all over the measured data in accordance with the characteristics of said detecting means, by making use of an integrated value of image data obtained after said correction.

* * * * *